(12) United States Patent
Kotary et al.

(10) Patent No.: US 11,922,172 B2
(45) Date of Patent: Mar. 5, 2024

(54) CONFIGURABLE REDUCED MEMORY STARTUP

(71) Applicant: Intel Corporation, Santa Clara, CA (US)

(72) Inventors: Karunakara Kotary, Portland, OR (US); Pannerkumar Rajagopal, Bangalore (IN); Satish Muthiyalu, Bangalore (IN); Rajesh Poornachandran, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 556 days.

(21) Appl. No.: 17/028,315

(22) Filed: Sep. 22, 2020

(65) Prior Publication Data

US 2021/0026649 A1 Jan. 28, 2021

(51) Int. Cl.
| | |
|---|---|
| *G06F 9/4401* | (2018.01) |
| *G06F 1/3212* | (2019.01) |
| *G06F 9/445* | (2018.01) |
| *G06F 9/451* | (2018.01) |
| *G06F 11/30* | (2006.01) |
| *G06F 11/34* | (2006.01) |
| *G06F 12/0873* | (2016.01) |
| *G06F 13/16* | (2006.01) |
| *G06F 13/40* | (2006.01) |
| *G11C 11/406* | (2006.01) |

(52) U.S. Cl.
CPC .......... *G06F 9/4403* (2013.01); *G06F 1/3212* (2013.01); *G06F 9/44505* (2013.01); *G06F 9/451* (2018.02); *G06F 11/3037* (2013.01); *G06F 11/3409* (2013.01); *G06F 12/0873* (2013.01); *G06F 13/1668* (2013.01); *G06F 13/4081* (2013.01); *G11C 11/40622* (2013.01)

(58) Field of Classification Search
CPC .. G06F 1/3212; G06F 1/3275; G06F 11/3037; G06F 11/3409; G06F 12/0873; G06F 13/1668; G06F 13/4081; G06F 9/4403; G06F 9/44505; G06F 9/451; G11C 11/40622; Y02D 10/00
See application file for complete search history.

(56) References Cited

U.S. PATENT DOCUMENTS

| | | | | |
|---|---|---|---|---|
| 2006/0095694 | A1* | 5/2006 | Hsieh ................... | G06F 12/0607 711/E12.079 |
| 2010/0332775 | A1* | 12/2010 | Kapil ................... | G06F 12/0607 711/E12.001 |

(Continued)

OTHER PUBLICATIONS

Intel Corporation, "Quality Manual," Feb. 2020, 16 pages.

(Continued)

*Primary Examiner* — Terrell S Johnson
(74) *Attorney, Agent, or Firm* — Jordan IP Law, LLC

(57) ABSTRACT

Systems, apparatuses and methods may provide for technology that enables, during a boot sequence, a first set of ranks in a memory module based on a battery status and a user interface and disables, during the boot sequence, a second set of ranks in the memory module based on the battery status and the user interface. The technology may also generate a map between a system address space and a first set of banks in the first set of ranks and exclude a second set of banks in the first set of ranks from the map.

25 Claims, 9 Drawing Sheets

(56) References Cited

U.S. PATENT DOCUMENTS

2015/0026393 A1\* 1/2015 Kaminaga ............. G06F 3/0688
 711/103
2017/0285722 A1\* 10/2017 Kim ...................... G06F 1/3296

OTHER PUBLICATIONS

Micron Technology, Inc., "Mobile Low-Power DDR SDRAM," 2011, 105 pages.
Standard Performance Evaluation Corporation, "Serf Suite," retrieved Jul. 27, 2020, 3 pages, <spec.org/sert/>.

\* cited by examiner

CONFIGURABLE REDUCED MEMORY STARTUP

CROSS-REFERENCE TO RELATED APPLICATIONS

The present application claims the benefit of priority to Indian Provisional Patent Application No. 202041033777 filed on Aug. 6, 2020.

TECHNICAL FIELD

Embodiments generally relate to computer memory. More particularly, embodiments relate to configurable reduced memory startup for efficient quality of service (QoS) on computing platforms.

BACKGROUND

With an ever-increasing need of more memory demand from end users, modern computing device manufacturers are designing computing devices such as laptops, desktops, server systems and phones with large amounts of memory. In addition to an increased bill of materials (BOM) cost of the platform, other significant challenges exist including increased TCO (total cost of ownership, e.g., power consumption of keeping the large platform memory operating irrespective of usage/needs), energy certification challenges (e.g., SERT® compliance), increased defects from a significant amount of memory, slower boot time due to bottlenecks associated with memory training, increased residual battery requirements to power-on all populated memory banks, etc. These challenges may be problematic in both client devices (e.g., with limited batteries, form factors) and in servers (TCO, energy compliance, etc.).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
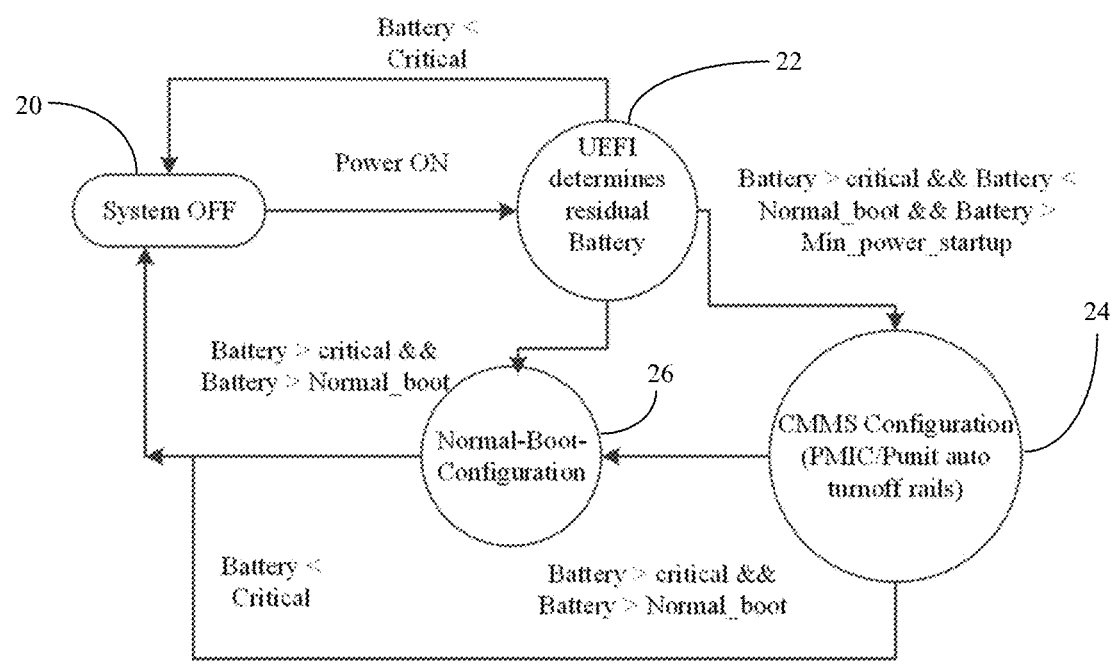
FIG. 1 is a block diagram of an example of a state machine according to an embodiment.

Existing solutions may keep an entire system memory in fully functional mode during system boot or active operation irrespective of the amount of active memory usage. Self-refresh mode is the only power saving mode widely in use when the system transitions to a low power state. Existing solutions lack efficient min-memory-management, thereby resulting in increased TCO, energy certification issues, increased DPM (defects per million). Accordingly, quality may reduce, booting may be slower, and the use of limited residual battery on mobile devices may be less efficient.

Embodiments propose a configurable min-memory-startup (CMMS) for efficient QoS (quality of service) on computing platforms that addresses the above challenges with large memory across client devices, IoT (Internet of Things) components, edge devices and cloud configurations. As a result, significant platform improvements are provided, as well as better TCO for customers/partners.

Embodiments address the question of whether memories are used to the fullest extent by all end users in all scenarios. In some scenarios, only a few users may fully use memory (e.g., the memory may not be fully utilized the majority of the time).

The CMMS technology involves:

System OS (operating system) settings or system management settings providing a user interface to configure/customize CMMS mode. System admin/users may provide a choice of memory bank configuration that is to be turned on during boot or post boot for efficient platform boot with limited residual battery thresholds.

A power delivery system (PMIC/power management integrated circuit, Punit) having the capability to sense residual battery charge state and current charging rate to determine the minimal platform memory configuration blocks that are turned ON to power-on the device as soon as possible in CMMS mode without compromising the device.

On a reboot, an early UEFI (unified extensible firmware interface) PI (platform initialization) driver monitoring the mobile device battery, If the battery is normal, the technology may startup all hardware and invoke the main mobile OS.

Else if <normal battery, read the EFI_MIN_MEMORY_STARTUP_POLICY and energize only the elements that have corresponding configuration bits asserted.

The UEFI is aware of the CMMS mode and exposes appropriate memory resource availability in the platform to drivers. Accordingly, the entire system stack from FW (firmware) to the UI (user interface) is dynamically tailored to be in CMMS mode.

Support seamless dynamic transition from the CMMS mode to the main OS operational mode with full feature and device support once sufficient battery and thermal thresholds are met without requiring a reboot.

Below is an example configuration while running in the early environment:

if battery <critical and battery not charging, shut down;
if battery <critical and battery charging, boot to charging mode;

if battery >CMMS_requirement, boot to MPS (Min Power Startup) mode;

if battery >normal_boot_requirement, boot to normal mode.

The CMMS technology involves the system identifying key memory banks to support quick boot based on UEFI BIOS usage pattern heuristics for a variety of CMMS profiles.

The CMMS technology provides maximum power savings and extends battery life for use cases where power is more important and extra memory is not critical. The CMMS technology also enables an extension of battery life under low battery scenarios. Moreover, the CMMS technology may be used to obtain energy certifications. Additional advantages include overall improved TCO savings, faster boot, optimal boot and scalable memory configuration based on system needs (e.g., dynamic switches from CMMS to normal mode), enabling hot swap of memory with uncorrectable errors by being in CMMS mode (e.g., avoiding usage of specific banks), and so forth.

FIG. 1 shows the system architecture and state machine 21 for the proposed CMMS mode. In the illustrated example, a power on event transitions the system from an off state 20 to a first state 22 in which the UEFI determines the residual battery level. If the residual battery level is less than a critical threshold, the system transitions from the first state 22 back to the off state 20. If the residual battery level is greater than the critical threshold, but less than a normal boot threshold and greater than a minimum power startup threshold, the system transitions from the first state 22 to a second state 24 that corresponds to a CMMS configuration (e.g., the PMIC/Punit automatically turns off power to the rails). When the battery level exceeds both the critical threshold and the normal boot threshold, the system transitions from the second state 24 to a third state 26 corresponding to the normal boot configuration. The system may also transition from the first state 22 to the third state 26 in response to the battery level exceeding both the critical threshold and the normal boot threshold. In an embodiment, the batter level dropping below the critical threshold causes the system to transition from the second state 24 or the third state 26 to the off state 20.

Figure 2:
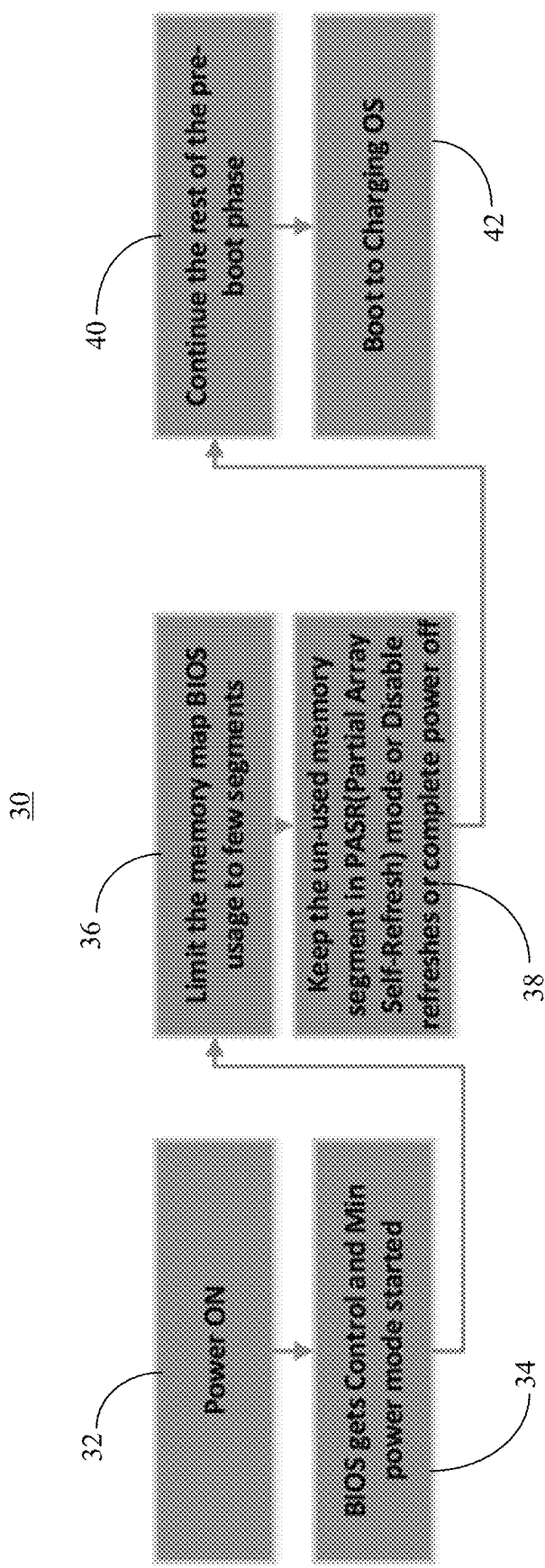
FIG. 2 is a flow diagram of an example of a boot flow according to an embodiment.

FIG. 2 shows the high-level boot operational flow 30 (e.g., with the middle blocks representing new and advantageous functionality). In the illustrated example, a Power ON event occurs at block 32, where BIOS obtains control and starts minimum power mode at block 34. In an embodiment, block 36 limits the memory map BIOS usage to a few segments. Additionally, block 38 may keep the unused memory segment in PASR (partial array self-refresh) mode, disables refreshes, or completely powers off the unused memory segment. Block 40 may continue the remainder of the pre-boot phase, where block 42 boots to the charging OS.

Figure 3:
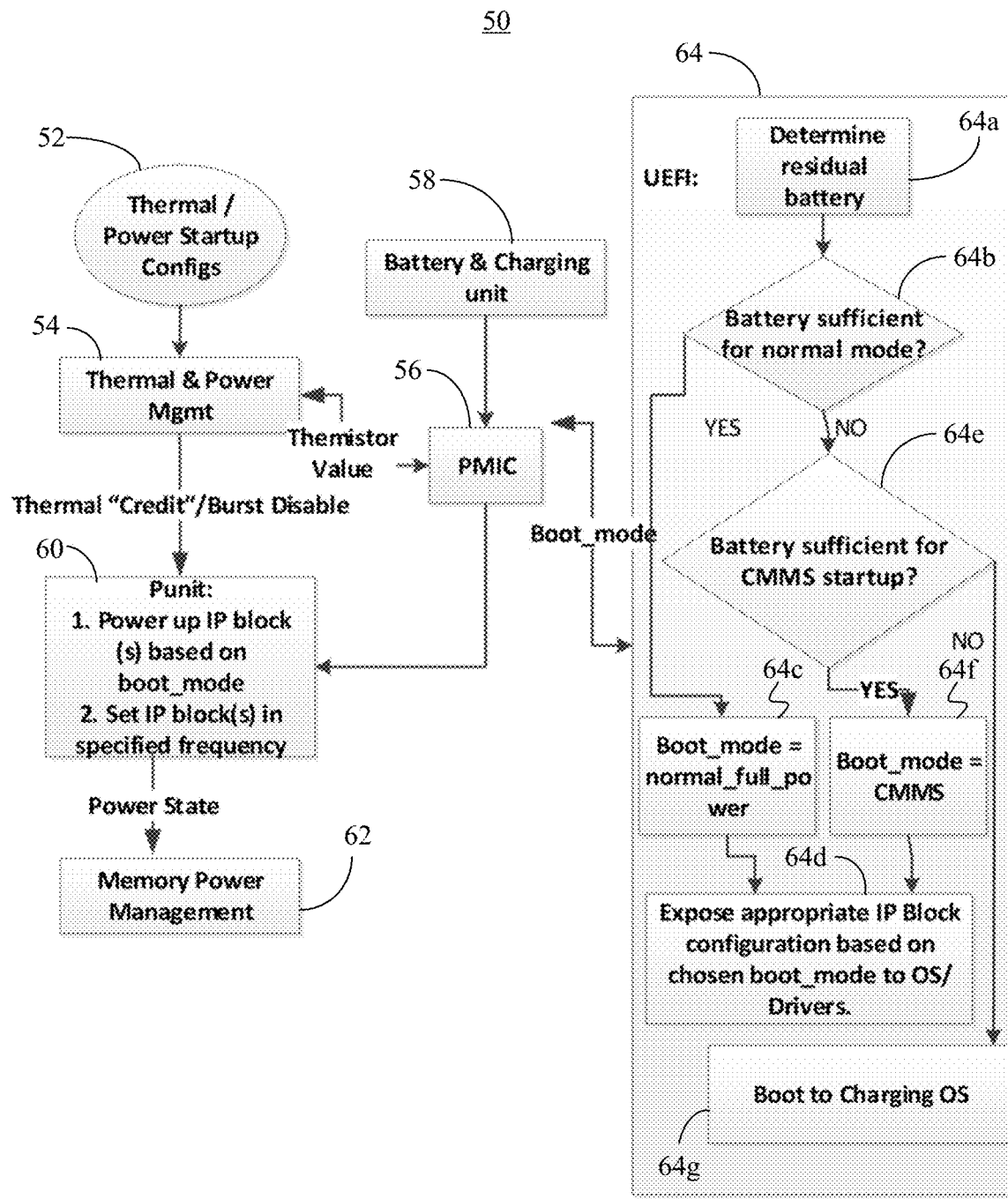
FIG. 3 is a flowchart of an example of an operational flow according to an embodiment.

FIG. 3 shows a process 50 from user interface to the UEFI configuring platform PMIC for CMMS mode. In the illustrated example, thermal and power startup configuration settings are established at block 52. Illustrated block 54 conducts thermal and power management, which may involve exchanging thermistor values with a PMIC block 56 that is coupled to a battery and charging unit 58. Block 54 sends a thermal "credit" (e.g., burst disable) message to a Punit block 60. In an embodiment, block 60 powers up one or more IP (intellectual property) blocks (e.g., functional domains) based on the boot mode and sets the IP block(s) to operate at a specified frequency. The Punit block 60 may send a power state message to a power management block 62.

In one example, the PMIC block 56 exchanges boot mode information with a UEFI 64 (64a-64g). UEFI block 64a determines the residual battery level, where a determination may be made at UEFI block 64b as to whether the battery level is sufficient for normal operation mode. If so, UEFI block 64c sets the boot mode to the normal full power mode and UEFI block 64d exposes the appropriate IP block configuration (e.g., based on the chosen boot mode) to the OS and/or drivers. If UEFI block 64b determines that the battery level is insufficient for normal operation mode, UEFI block 64e determines whether the battery level is sufficient for CMMS startup. If the battery level is sufficient for CMMS startup, UEFI block 64f may set the boot mode to CMMS and the flow proceeds to UEFI block 64d. If UEFI block 64e determines that the battery level is insufficient for CMMS startup, UEFI block 64g may boot to charging OS.

Figure 5:
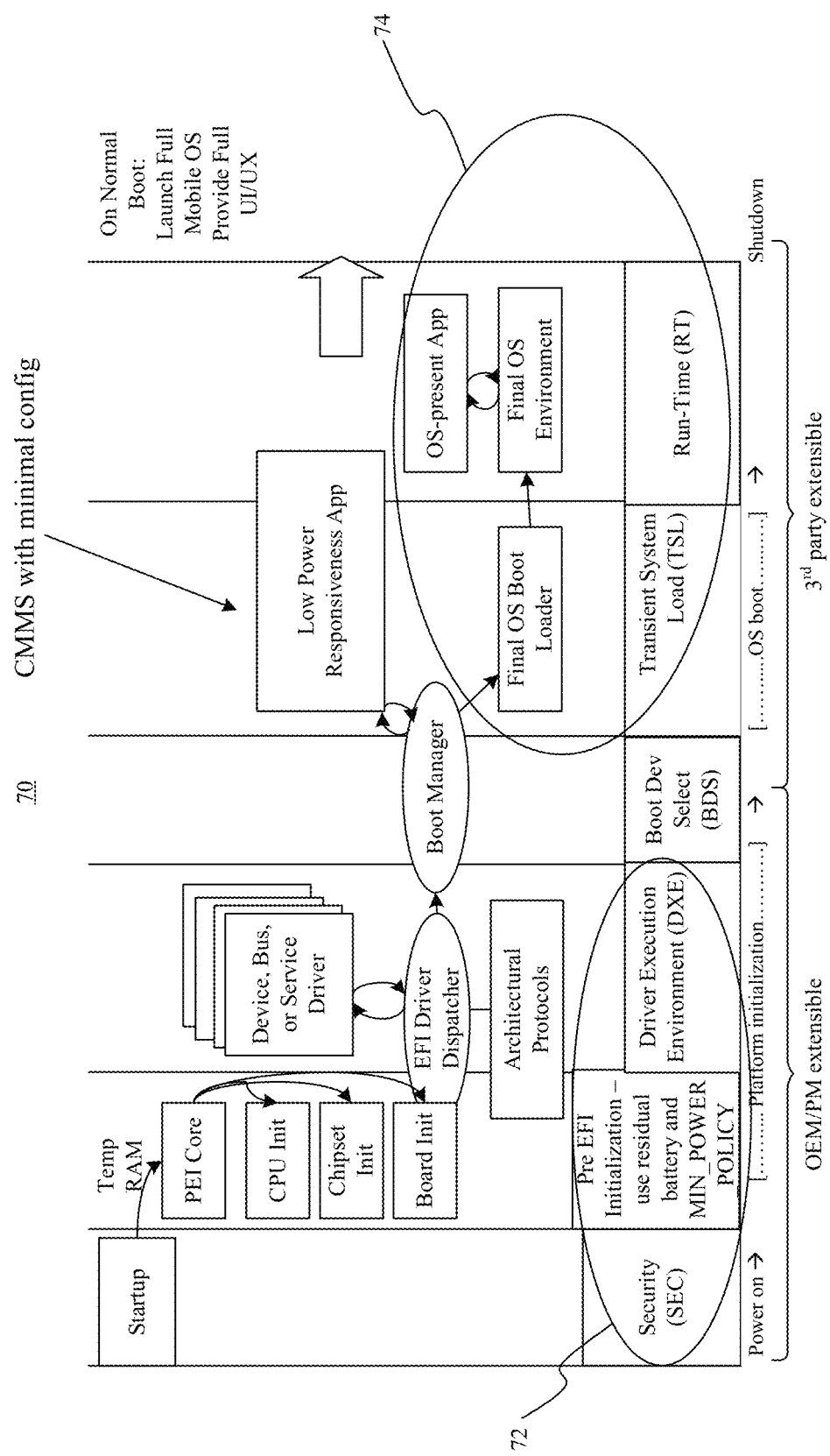
FIG. 5 is an illustration of an example of an operational flow to transition from configurable min-memory-startup (CMMS) to normal mode according to an embodiment.

FIG. 5 shows an example boot flow 70 in CMMS mode versus normal mode and a transitioning from CMMS to Normal mode. In the illustrated example, a pre-EFI initialization (PEI) 72 uses residual battery and a minimum power policy. Additionally, a transient system load (TSL) and run-time (RT) sequence 74 runs a final OS boot loader, a final OS environment and an OS-present application.

Figure 4:
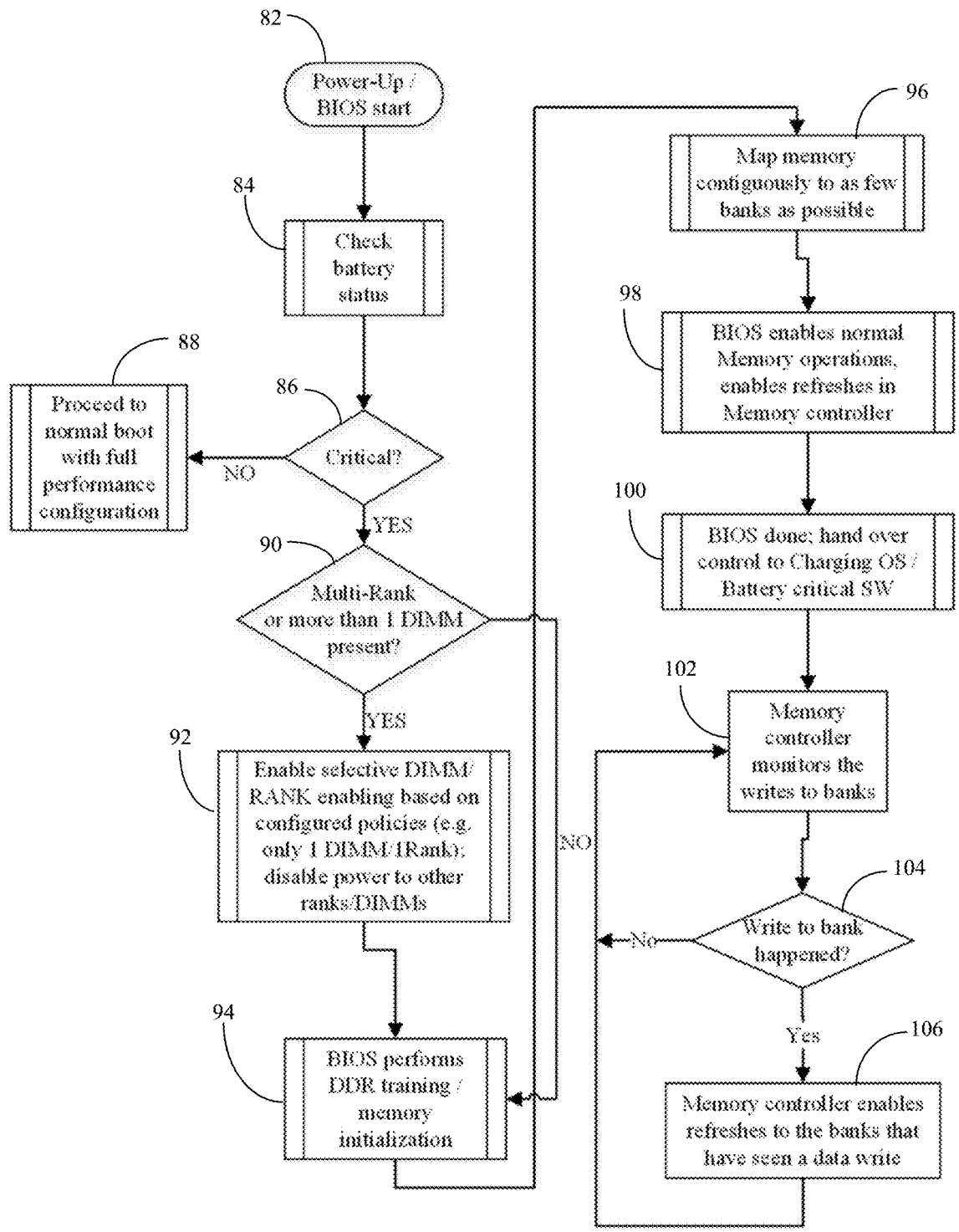
FIG. 4 is a flowchart of an example of an operational flow to disable refreshes to unused ranks according to an embodiment.

An example CMMS mode involves the following power-save configurations:

Disable Refreshes to Unused Ranks/Banks (FIG. 4)

Memory Reference Code (MRC, e.g., memory initialization code) may disable refreshes to unused ranks (e.g., train the unused ranks, but keep refreshes disabled). Because the unused ranks are not used for boot, refresh may be enabled only upon hand-off to the OS. This functionality may be achieved with a change in the memory controller (MC), as well. For example, the MC monitors the traffic to each bank/rank. According to JEDEC (Joint Electron Device Engineering Council), a bank is a block of memory within a DRAM (dynamic random access memory) chip, while a rank is a block of memory on a module (e.g., what was formerly called a two-sided or two-bank module may now be called a two-rank module). If a bank/rank has not encountered a single write command, then the MC may intelligently save power by not issuing refreshes to such banks/ranks as there is no valid content.

A change to the scheduler logic in the memory controller (MC) may keep track of writes to banks and/or ranks and enable refreshes and self-refreshes only if the bank or rank has encountered a write. In the existing solutions, SW (software) control for enabling/disabling refresh may be available at a rank level. With the proposed change, the MC can decide to control refreshes at the bank granularity, providing more power savings (e.g., a system implementation could employ two different memory mapping schemes—one for low battery/high power saving scenarios and another for regular boot/performance scenarios).

The power saving memory map scheme may choose to map the contiguous block of DRAM space from only a few banks in the rank to the system address space. In this case, the memory controller schedules "writes" (write operations) only to the few banks mapped to system space. All other banks would be idle, and no writes would have occurred with respect to these banks. The modified memory controller scheduler logic disables refreshes to the banks that have not seen any write. Thus, more power is saved than in existing solutions when a rank is actively used—more power savings coming from a subset of banks in a rank not being refreshed.

A power control electronic switch may be added in the power supply path to individual ranks in DIMM or platform. This switch enables SW (e.g., BIOS) to completely disable power to unused ranks within a DIMM (dual inline memory module) or a DIMM as a whole (e.g., if supported by the platform implementation).

Power Down the Rank or DIMM Completely

For a memory down configuration, the DRAM devices (and hence the ranks) may be powered off (e.g., using platform control). For a DIMM, changes may be made to the DIMM specification to provide independent power control for individual ranks. Platform changes may be made to control power for individual DIMMs independently to conduct DIMM level power off. A downside to such an approach may be that, on power-up, a JEDEC initialization sequence may be needed to initialize DRAMs (e.g., some minimal training may be conducted based on DIMM type). Such an approach may therefore involve more latency. One of the potential options to mitigate high latency is to cache the initialization vectors and re-use the cached vectors across configuration modes/profiles.

In order to share policy information with the platform, the following policy object may be defined:

```
#define EFI_MIN_MEMORY_STARTUP_POLICY_GUID \
0xbd8f7aa5, 0xa7f5, 0x46b5, 0x80, 0x7f, 0xb6, 0x58, 0x6b, 0xd, 0x2f,
0xaa);
```

Configuration object structure:

```
typedef struct {
    MEMORY_PROPERTIES           props;
    MEMORY CONFIGURATIONconfigs;
    PERFORMANCE_CONFIGURATION Perf;
    UI_ELEMENTS_CONFIGURATION ui;
    STORAGE_CONFIGURATION   Storage;
    HOTSWAP_CONFIGURATION   hotswap;
} EFI_MIN_MEMORY_STARTUP_POLICY;
```

In an embodiment, the full OS exposes the above configuration through a friendly UI (FIG. 1) that eventually performs a UEFI→SetVariable( ) call such that on a reduce performance re-boot, a CMMS driver uses the policy to decide what hardware to energize and how to parameterize the user interface.

More particularly, FIG. 4 shows a method 80 in which a power-up and BIOS start occurs at block 82. In an embodiment, block 84 checks the battery status, where a determination may be made at block 86 as to whether the battery status indicates a critical level. If the battery status does not indicate a critical level, illustrated block 88 proceeds to normal boot with a full performance configuration. Otherwise, block 90 may determine whether either multiple ranks or more than one DIMM is present. If so, block 92 enables selecting DIMM/rank enabling based on configured policies (e.g., only one DIMM per rank). Block 92 may also disable power to the other ranks/DIMMs. Illustrated block 94 uses BIOS to perform DDR training and/or memory initialization. If it is determined at block 90 that neither multiple ranks nor more than one DIMM is present, the method 80 may bypass block 92 and proceed directly to block 94.

Block 96 may provide for mapping memory contiguously to as few banks as possible. In an embodiment, block 98 enables normal memory operations and refreshes in the memory controller. Once the BIOS is done, block 100 hands over control to the charging OS and battery critical software. Additionally, the memory controller may monitor writes to banks at block 102, where a determination is made at block 104 as to whether a write has occurred with respect to a monitored bank. If so, the memory controller enables refreshes to the banks that have encountered a data write at block 106. The illustrated method 80 then returns to block 102. If it is determined at block 104 that a write has not occurred with respect to a monitored bank, the method 80 may bypass block 106 and proceed directly to block 102. Blocks 92, 96, 102, 104 and 106, which are not present in conventional systems, provide significant performance advantages.

Figure 6:
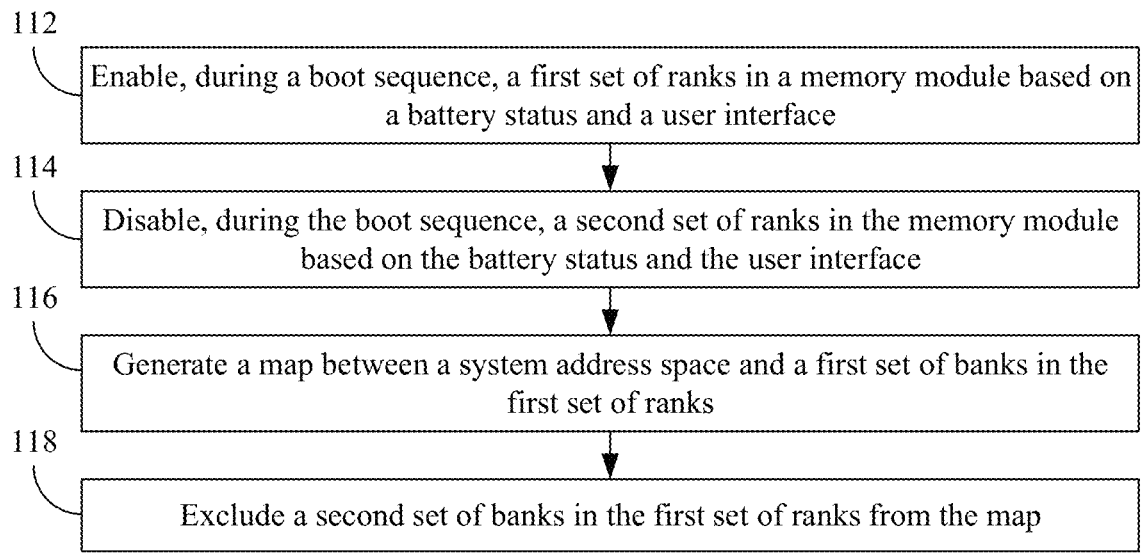
FIG. 6 is a flowchart of an example of a method of operating a basic input output system (BIOS) in a performance-enhanced computing system according to an embodiment.

FIG. 6 shows a method 110 of operating a BIOS in a performance-enhanced computing system. The method 110 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/ or other structural components that are native to hardware (e.g., host processor, central processing unit/CPU, microcontroller, etc.).

The illustrated processing block 112 provides for enabling, during a boot sequence, a first set of ranks in a memory module based on a battery status and a user interface. In one example, block 114 disables, during the boot sequence, a second set of ranks in the memory module based on the battery status and the user interface. In an embodiment, the battery status indicates that a residual battery charge state is less than a normal threshold and greater that a reduced (e.g., minimum) memory startup threshold. In one example, the user interface includes a configuration object structure that defines one or more of memory properties, a memory configuration, a performance configuration, a UI elements configuration, a storage configuration or a hot swap configuration. Illustrated processing block 116 also provides for generating a map between a system address space and a first set of banks in the first set of ranks, where block 118 excludes a second set of banks in the first set of ranks from the map. In an embodiment, the map is associated with a low battery mapping scheme.

Figure 7:
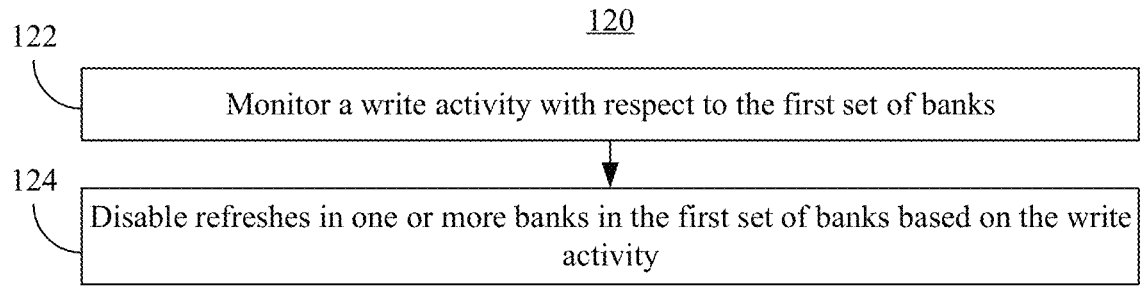
FIG. 7 is a flowchart of an example of a method of operating a memory controller in a performance-enhanced computing system.

FIG. 7 shows a method 120 of operating a memory controller in a performance-enhanced computing system. The method 120 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof. Illustrated block 122 provides for monitoring a write activity with respect to the first set of banks, where block 124 disables refreshes in one or more banks in the first set of banks based on the write activity.

Figure 8:
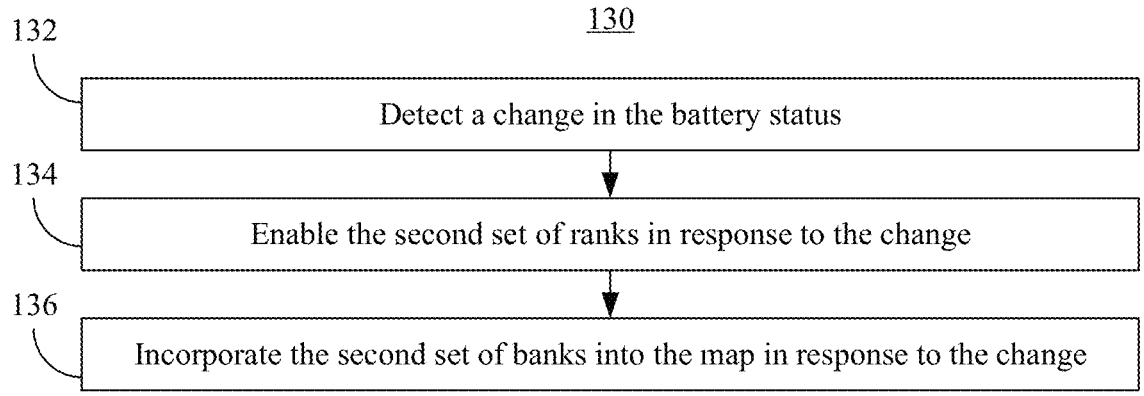
FIG. 8 is a flowchart of an example of a method of transitioning to normal mode according to an embodiment.

FIG. 8 shows a method 130 of transitioning to normal mode. The method 130 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 132 provides for detecting a change in the battery status. Block 132 may also provide for collecting telemetry (e.g., usage) data during the CMMS mode, wherein the telemetry data is associated with the first set of ranks and the second set of ranks. Such an approach may further enhance scalability by supporting the development of future enhancements. In an embodiment, block 134 enables the second set of ranks in response to the change, where block 136 incorporates the second set of banks into the map in response to the change. In an embodiment, the change indicates that a residual battery charge state is greater than the normal threshold.

Figure 9:
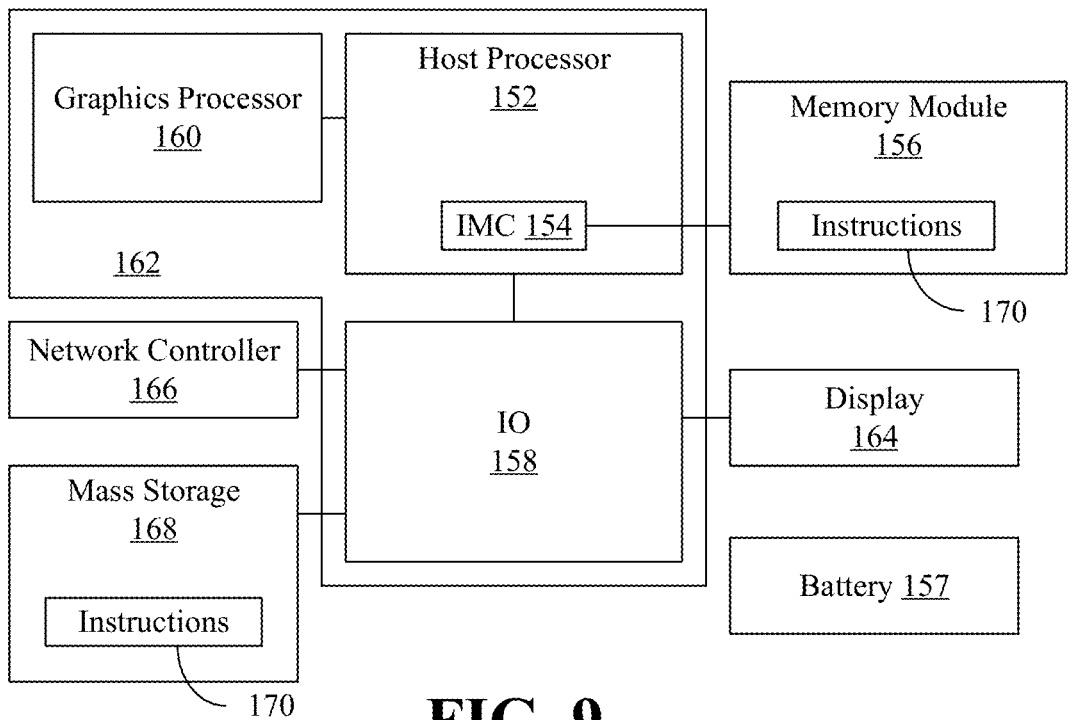
FIG. 9 is a block diagram of an example of a performance-enhanced computing system according to an embodiment.

FIG. 9 shows a computing system 150 including executable program instructions 170, which when executed by one or more of a host processor 152, a graphics processor 160 or an input/output module (IO) 158, cause the computing system 150 to perform one or more aspects of the method 110 (FIG. 6), the method 120 (FIG. 7) and/or the method 130 (FIG. 8), already discussed. In an embodiment, the instructions 170 are retrieved from a memory module 156 (e.g., DIMM) and/or mass storage 168. Additionally, the graphics processor 160, the host processor 152 and/or the IO module 158 are incorporated into a system on chip (SoC) 162, which is also coupled to a display 164 and/or a network controller 166 (wireless, wired). The illustrated system 150 also includes a battery 157.

Figure 10:
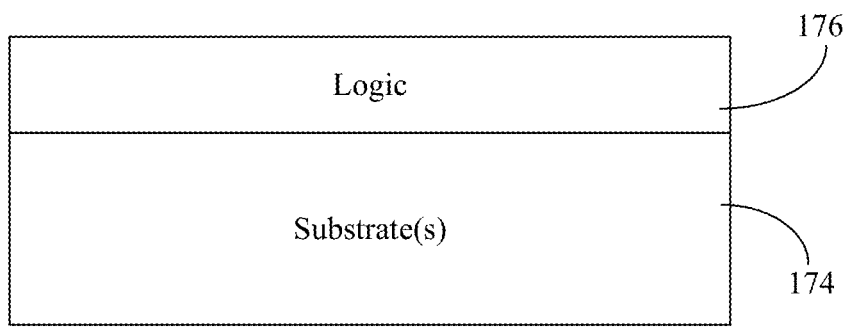
FIG. 10 is an illustration of an example of a semiconductor apparatus according to an embodiment.

FIG. 10 shows a semiconductor package apparatus 172. The illustrated apparatus 172 includes one or more substrates 174 (e.g., silicon, sapphire, gallium arsenide) and logic 176 (e.g., transistor array and other integrated circuit/IC components) coupled to the substrate(s) 174. The logic 176 may be implemented at least partly in configurable logic or fixed-functionality logic hardware. In one example, the logic 176 implements one or more aspects of the method 110 (FIG. 6), the method 120 (FIG. 7) and/or the method 130 (FIG. 8), already discussed.

In one example, the logic 176 includes transistor channel regions that are positioned (e.g., embedded) within the substrate(s) 174. Thus, the interface between the logic 176 and the substrate(s) 174 may not be an abrupt junction. The logic 176 may also be considered to include an epitaxial layer that is grown on an initial wafer of the substrate(s) 174.

Figure 11:
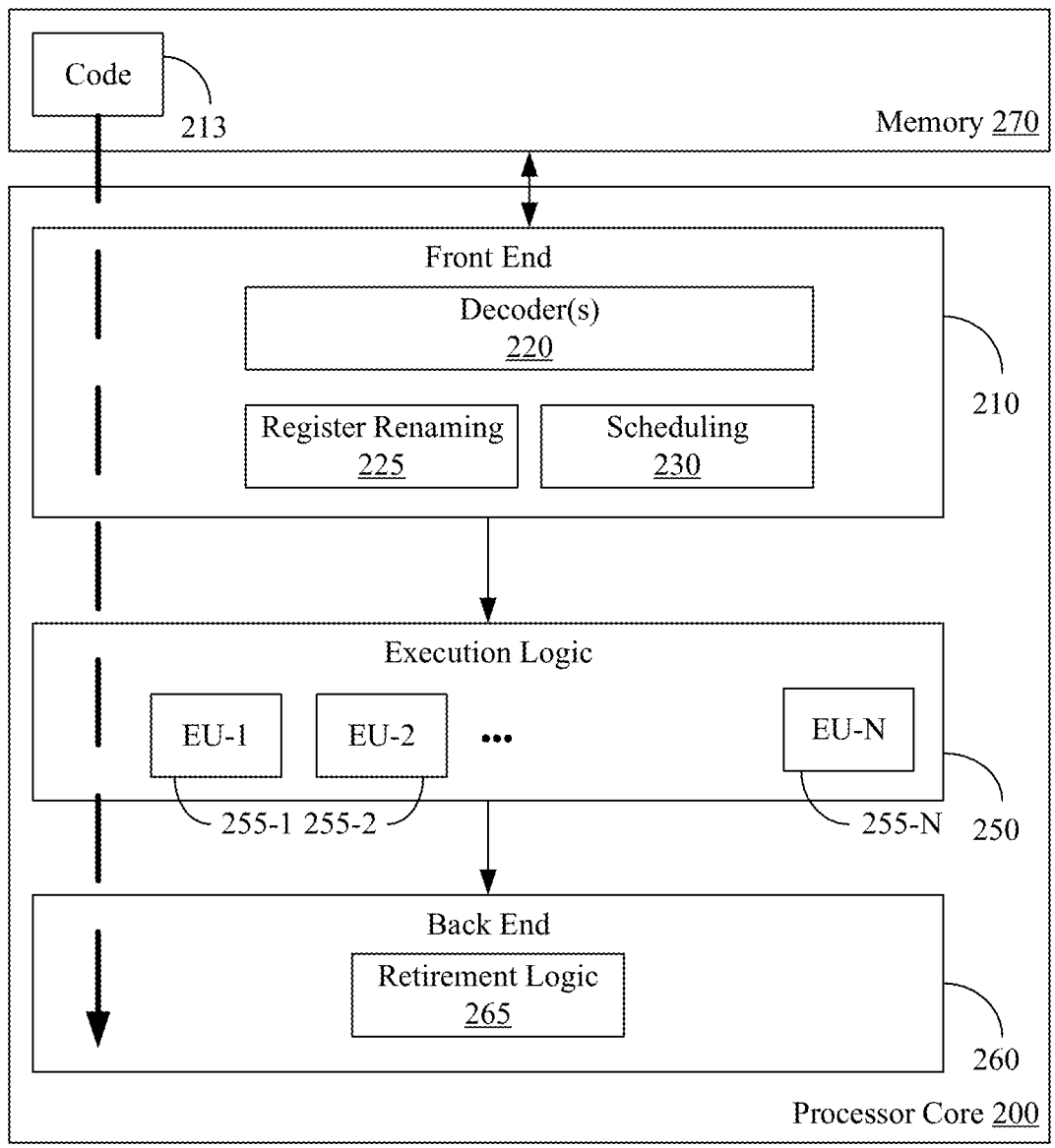
FIG. 11 is a block diagram of an example of a processor according to an embodiment.

FIG. 11 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 11, a processing element may alternatively include more than one of the processor core 200 illustrated in FIG. 11. The processor core 200 may be a single-threaded core or, for at least one embodiment, the processor core 200 may be multithreaded in that it may include more than one hardware thread context (or "logical processor") per core.

FIG. 11 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the method 110 (FIG. 6), the method 120 (FIG. 7) and/or the method 130 (FIG. 8), already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 11, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 12:
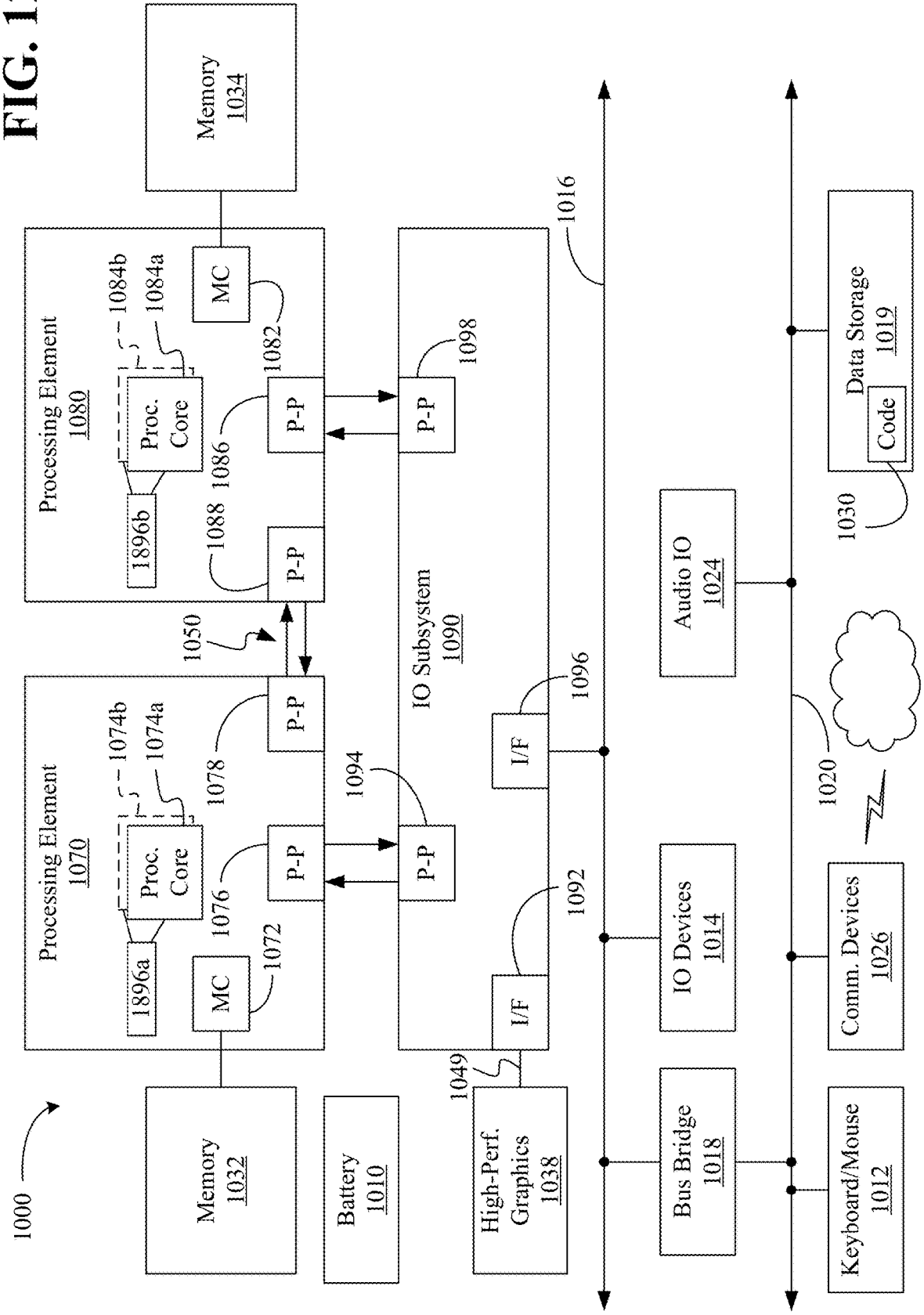
FIG. 12 is a block diagram of an example of a multi-processor based computing system according to an embodiment.

Referring now to FIG. 12, shown is a block diagram of a computing system 1000 embodiment in accordance with an embodiment. Shown in FIG. 12 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 12 may be implemented as a multi-drop bus rather than point-to-point interconnect.

As shown in FIG. 12, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 11.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 12, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 12, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 12, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement one or more aspects of the method 110 (FIG. 6), the method 120 (FIG. 7) and/or the method 130 (FIG. 8), already discussed. Further, an audio I/O 1024 may be coupled to second bus 1020 and a battery 1010 may supply power to the computing system 1000.

Note that other embodiments are contemplated. For example, instead of the point-to-point architecture of FIG. 12, a system may implement a multi-drop bus or another such communication topology. Also, the elements of FIG. 12 may alternatively be partitioned using more or fewer integrated chips than shown in FIG. 12.

ADDITIONAL NOTES AND EXAMPLES

Example 1 includes a computing system comprising a network controller, a processor coupled to the network controller, and a memory module coupled to the processor, the memory module including a set of instructions, which when executed by the processor, cause the processor to enable, during a boot sequence, a first set of ranks in the memory module based on a battery status and a user interface, disable, during the boot sequence, a second set of ranks in the memory module based on the battery status and the user interface, generate a map between a system address space and a first set of banks in the first set of ranks, and exclude a second set of banks in the first set of ranks from the map.

Example 2 includes the computing system of Example 1, further including a memory controller, wherein when executed by the memory controller, the instructions cause the memory controller to monitor a write activity with respect to the first set of banks, and disable refreshes in one or banks in the first set of banks based on the write activity.

Example 3 includes the computing system of Example 1, wherein the user interface is to include a configuration object structure that defines one or more of memory properties, a memory configuration, a performance configuration, a user interface elements configuration, a storage configuration or a hot swap configuration.

Example 4 includes the computing system of Example 1, wherein the battery status is to indicate that a residual battery charge state is less than a normal threshold and greater than a reduced memory startup threshold, and wherein the map is to be associated with a low battery mapping scheme.

Example 5 includes the computing system of any one of Examples 1 to 4, wherein the instructions, when executed by the processor, further cause the processor to collect telemetry data during a configurable min-memory-startup mode, wherein the telemetry data is to be associated with the first set of ranks and the second set of ranks, detect a change in the battery status, enable the second set of ranks in response to the change, and incorporate the second set of banks into the map in response to the change.

Example 6 includes the computing system of Example 5, wherein the change is to indicate that a residual battery charge state is greater than a normal threshold.

Example 7 includes a semiconductor apparatus comprising one or more substrates, and logic coupled to the one or more substrates, wherein the logic is implemented at least partly in one or more of configurable logic or fixed-functionality hardware logic, the logic coupled to the one or more substrates to enable, during a boot sequence, a first set of ranks in a memory module based on a battery status and a user interface, disable, during the boot sequence, a second set of ranks in the memory module based on the battery status and the user interface, generate a map between a system address space and a first set of banks in the first set of ranks, and exclude a second set of banks in the first set of ranks from the map.

Example 8 includes the apparatus of Example 7, wherein the logic coupled to the one or more substrates is to monitor a write activity with respect to the first set of banks, and disable refreshes in one or banks in the first set of banks based on the write activity.

Example 9 includes the apparatus of Example 7, wherein the user interface is to include a configuration object structure that defines one or more of memory properties, a memory configuration, a performance configuration, a user interface elements configuration, a storage configuration or a hot swap configuration.

Example 10 includes the apparatus of Example 7, wherein the battery status is to indicate that a residual battery charge state is less than a normal threshold and greater than a reduced memory startup threshold, and wherein the map is to be associated with a low battery mapping scheme.

Example 11 includes the apparatus of any one of Examples 7 to 10, wherein the logic coupled to the one or more substrates is to collect telemetry data during a configurable min-memory-startup mode, wherein the telemetry data is to be associated with the first set of ranks and the second set of ranks, detect a change in the battery status, enable the second set of ranks in response to the change, and incorporate the second set of banks into the map in response to the change.

Example 12 includes the apparatus of Example 11, wherein the change is to indicate that a residual battery charge state is greater than a normal threshold.

Example 13 includes the apparatus of any one of Examples 7 to 12, wherein the logic coupled to the one or more substrates includes transistor channel regions that are positioned within the one or more substrates.

Example 14 includes at least one computer readable storage medium comprising a set of instructions, which when executed by a computing system, cause the computing system to enable, during a boot sequence, a first set of ranks in a memory module based on a battery status and a user interface, disable, during the boot sequence, a second set of ranks in the memory module based on the battery status and the user interface, generate a map between a system address space and a first set of banks in the first set of ranks, and exclude a second set of banks in the first set of ranks from the map.

Example 15 includes the at least one computer readable storage medium of Example 14, wherein the instructions, when executed, further cause the computing system to monitor a write activity with respect to the first set of banks, and disable refreshes in one or banks in the first set of banks based on the write activity.

Example 16 includes the at least one computer readable storage medium of Example 14, wherein the user interface is to include a configuration object structure that defines one or more of memory properties, a memory configuration, a performance configuration, a user interface elements configuration, a storage configuration or a hot swap configuration.

Example 17 includes the at least one computer readable storage medium of Example 14, wherein the battery status is to indicate that a residual battery charge state is less than a normal threshold and greater than a reduced memory startup threshold, and wherein the map is to be associated with a low battery mapping scheme.

Example 18 includes the at least one computer readable storage medium of any one of Examples 14 to 17, wherein the instructions, when executed, further cause the computing system to collect telemetry data during a configurable min-memory-startup mode, wherein the telemetry data is to be associated with the first set of ranks and the second set of ranks, detect a change in the battery status, enable the second set of ranks in response to the change, and incorporate the second set of banks into the map in response to the change.

Example 19 includes the at least one computer readable storage medium of Example 18, wherein the change is to indicate that a residual battery charge state is greater than a normal threshold.

Example 20 includes a method comprising enabling, during a boot sequence, a first set of ranks in a memory module based on a battery status and a user interface, disabling, during the boot sequence, a second set of ranks in the memory module based on the battery status and the user interface, generating a map between a system address space and a first set of banks in the first set of ranks, and excluding a second set of banks in the first set of ranks from the map.

Example 21 includes the method of Example 20, further including monitoring a write activity with respect to the first set of banks, and disabling refreshes in one or more banks in the first set of banks based on the write activity.

Example 22 includes the method of Example 20, wherein the user interface is to includes a configuration object structure that defines one or more of memory properties, a memory configuration, a performance configuration, a user interface elements configuration, a storage configuration or a hot swap configuration.

Example 23 includes the method of Example 20, wherein the battery status indicates that a residual battery charge state is less than a normal threshold and greater than a reduced memory startup threshold, and wherein the map is associated with a low battery mapping scheme.

Example 24 includes the method of any one of Examples 20 to 23, further including collecting telemetry data during a configurable min-memory-startup mode, wherein the telemetry data is to be associated with the first set of ranks and the second set of ranks, detecting a change in the battery status, enabling the second set of ranks in response to the change, and incorporating the second set of banks into the map in response to the change.

Example 25 includes the method of Example 24, wherein the change indicates that a residual battery charge state is greater than a normal threshold.

Example 26 includes means for performing the method of any one of Examples 20 to 25.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the computing system within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a network controller;
a processor coupled to the network controller; and
a memory module coupled to the processor, the memory module including set of instructions, which when executed by the processor, cause the processor to:
  enable, during a boot sequence, a first set of ranks in the memory module based on a battery status and a user interface,
  disable, during the boot sequence, a second set of ranks in the memory module based on the battery status and the user interface,
  generate a map between a system address space and a first set of banks in the first set of ranks, and
  exclude a second set of banks in the first set of ranks from the map.

2. The computing system of claim 1, further including a memory controller, wherein when executed by the memory controller, the instructions cause the memory controller to:
  monitor a write activity with respect to the first set of banks, and
  disable refreshes in one or banks in the first set of banks based on the write activity.

3. The computing system of claim 1, wherein the user interface is to include a configuration object structure that defines one or more of memory properties, a memory configuration, a performance configuration, a user interface elements configuration, a storage configuration or a hot swap configuration.

4. The computing system of claim 1, wherein the battery status is to indicate that a residual battery charge state is less than a normal threshold and greater than a reduced memory startup threshold, and wherein the map is to be associated with a low battery mapping scheme.

5. The computing system of claim 1, wherein the instructions, when executed by the processor, further cause the processor to:
  collect telemetry data during a configurable min-memory-startup mode, wherein the telemetry data is to be associated with the first set of ranks and the second set of ranks,
  detect a change in the battery status,
  enable the second set of ranks in response to the change, and
  incorporate the second set of banks into the map in response to the change.

6. The computing system of claim 5, wherein the change is to indicate that a residual battery charge state is greater than a normal threshold.

7. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
  enable, during a boot sequence, a first set of ranks in a memory module based on a battery status and a user interface;
  disable, during the boot sequence, a second set of ranks in the memory module based on the battery status and the user interface;
  generate a map between a system address space and a first set of banks in the first set of ranks; and
  exclude a second set of banks in the first set of ranks from the map.

8. The apparatus of claim 7, wherein the logic coupled to the one or more substrates is to:
  monitor a write activity with respect to the first set of banks; and
  disable refreshes in one or banks in the first set of banks based on the write activity.

9. The apparatus of claim 7, wherein the user interface is to include a configuration object structure that defines one or more of memory properties, a memory configuration, a performance configuration, a user interface elements configuration, a storage configuration or a hot swap configuration.

10. The apparatus of claim 7, wherein the battery status is to indicate that a residual battery charge state is less than a normal threshold and greater than a reduced memory startup threshold, and wherein the map is to be associated with a low battery mapping scheme.

11. The apparatus of claim 7, wherein the logic coupled to the one or more substrates is to:
collect telemetry data during a configurable min-memory-startup mode, wherein the telemetry data is to be associated with the first set of ranks and the second set of ranks;
detect a change in the battery status;
enable the second set of ranks in response to the change; and
incorporate the second set of banks into the map in response to the change.

12. The apparatus of claim 11, wherein the change is to indicate that a residual battery charge state is greater than a normal threshold.

13. The apparatus of claim 7, wherein the logic coupled to the one or more substrates includes transistor channel regions that are positioned within the one or more substrates.

14. At least one non-transitory computer readable storage medium comprising a set of instructions, which when executed by a computing system, cause the computing system to:
enable, during a boot sequence, a first set of ranks in a memory module based on a battery status and a user interface;
disable, during the boot sequence, a second set of ranks in the memory module based on the battery status and the user interface;
generate a map between a system address space and a first set of banks in the first set of ranks; and
exclude a second set of banks in the first set of ranks from the map.

15. The at least one non-transitory computer readable storage medium of claim 14, wherein the instructions, when executed, further cause the computing system to:
monitor a write activity with respect to the first set of banks; and
disable refreshes in one or banks in the first set of banks based on the write activity.

16. The at least one non-transitory computer readable storage medium of claim 14, wherein the user interface is to include a configuration object structure that defines one or more of memory properties, a memory configuration, a performance configuration, a user interface elements configuration, a storage configuration or a hot swap configuration.

17. The at least one non-transitory computer readable storage medium of claim 14, wherein the battery status is to indicate that a residual battery charge state is less than a normal threshold and greater than a reduced memory startup threshold, and wherein the map is to be associated with a low battery mapping scheme.

18. The at least one non-transitory computer readable storage medium of claim 14, wherein the instructions, when executed, further cause the computing system to:
collect telemetry data during a configurable min-memory-startup mode, wherein the telemetry data is to be associated with the first set of ranks and the second set of ranks;
detect a change in the battery status;
enable the second set of ranks in response to the change; and
incorporate the second set of banks into the map in response to the change.

19. The at least one non-transitory computer readable storage medium of claim 18, wherein the change is to indicate that a residual battery charge state is greater than a normal threshold.

20. A method comprising:
enabling, during a boot sequence, a first set of ranks in a memory module based on a battery status and a user interface;
disabling, during the boot sequence, a second set of ranks in the memory module based on the battery status and the user interface;
generating a map between a system address space and a first set of banks in the first set of ranks; and
excluding a second set of banks in the first set of ranks from the map.

21. The method of claim 20, further including:
monitoring a write activity with respect to the first set of banks; and
disabling refreshes in one or more banks in the first set of banks based on the write activity.

22. The method of claim 20, wherein the user interface is to includes a configuration object structure that defines one or more of memory properties, a memory configuration, a performance configuration, a user interface elements configuration, a storage configuration or a hot swap configuration.

23. The method of claim 20, wherein the battery status indicates that a residual battery charge state is less than a normal threshold and greater than a reduced memory startup threshold, and wherein the map is associated with a low battery mapping scheme.

24. The method of claim 20, further including:
collecting telemetry data during a configurable min-memory-startup mode, wherein the telemetry data is associated with the first set of ranks and the second set of ranks;
detecting a change in the battery status;
enabling the second set of ranks in response to the change; and
incorporating the second set of banks into the map in response to the change.

25. The method of claim 24, wherein the change indicates that a residual battery charge state is greater than a normal threshold.

* * * * *